United States Patent
Lin

(10) Patent No.: US 10,418,108 B1
(45) Date of Patent: Sep. 17, 2019

(54) PROGRAM SCHEME IN 3D NAND FLASH MEMORY

(71) Applicant: MACRONIX INTERNATIONAL CO., LTD., Hsinchu (TW)

(72) Inventor: Lee-Yin Lin, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/926,217

(22) Filed: Mar. 20, 2018

(51) Int. Cl.
 *G11C 11/34*   (2006.01)
 *G11C 16/04*   (2006.01)
 *G11C 16/10*   (2006.01)
 *G11C 16/34*   (2006.01)

(52) U.S. Cl.
 CPC .......... *G11C 16/10* (2013.01); *G11C 16/0483* (2013.01); *G11C 16/3427* (2013.01)

(58) Field of Classification Search
 CPC .. G11C 16/10; G11C 16/0483; G11C 16/3427
 See application file for complete search history.

(56) References Cited

U.S. PATENT DOCUMENTS

| | | | |
|---|---|---|---|
| 8,289,774 B2 | 10/2012 | Moon et al. | |
| 8,385,115 B2 | 2/2013 | Lee et al. | |
| 8,842,479 B2 | 9/2014 | Huang et al. | |
| 9,171,627 B2 | 10/2015 | Lee et al. | |
| 9,478,259 B1* | 10/2016 | Yeh ........................ | G11C 5/06 |
| 9,564,223 B2 | 2/2017 | Jung | |
| 9,691,490 B2 | 6/2017 | Choi et al. | |
| 2010/0097862 A1 | 4/2010 | Kang et al. | |
| 2013/0009235 A1* | 1/2013 | Yoo ..................... | H01L 29/7926 257/329 |
| 2014/0097484 A1* | 4/2014 | Seol .................. | H01L 29/42332 257/324 |
| 2014/0369116 A1* | 12/2014 | Sakui .................. | G11C 16/3427 365/185.02 |
| 2016/0099060 A1 | 4/2016 | Yoo | |
| 2016/0217865 A1 | 7/2016 | Chen et al. | |
| 2016/0260732 A1* | 9/2016 | Lue .................... | H01L 27/11582 |
| 2017/0330631 A1 | 11/2017 | Diep et al. | |
| 2018/0102177 A1* | 4/2018 | Wu ..................... | G11C 16/3427 |

* cited by examiner

*Primary Examiner* — Toan K Le
(74) *Attorney, Agent, or Firm* — Haynes Beffel & Wolfeld LLP

(57) ABSTRACT

A memory device comprises a plurality of stacks of word lines, the word lines in the stacks having first vertical sides and second vertical sides opposite the first vertical sides, and a first plurality of strings and a second plurality of strings disposed respectively on the first vertical sides and the second vertical sides of the word lines in a particular stack in the plurality of stacks. The second plurality of strings is offset from the first plurality of strings in a direction along which the word lines in the particular stack extend. A first program operation includes applying a shielding voltage to a first string in the first plurality of strings and a fourth string in the second plurality of strings, and applying a program voltage to a second string in the second plurality of strings and a third string in the first plurality of strings.

20 Claims, 12 Drawing Sheets

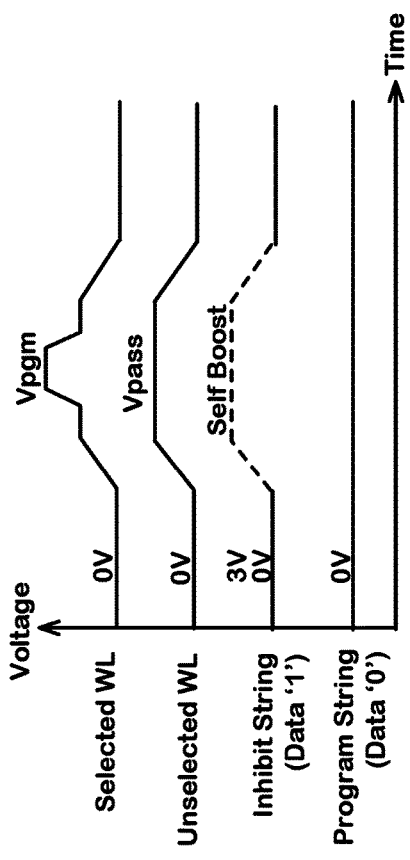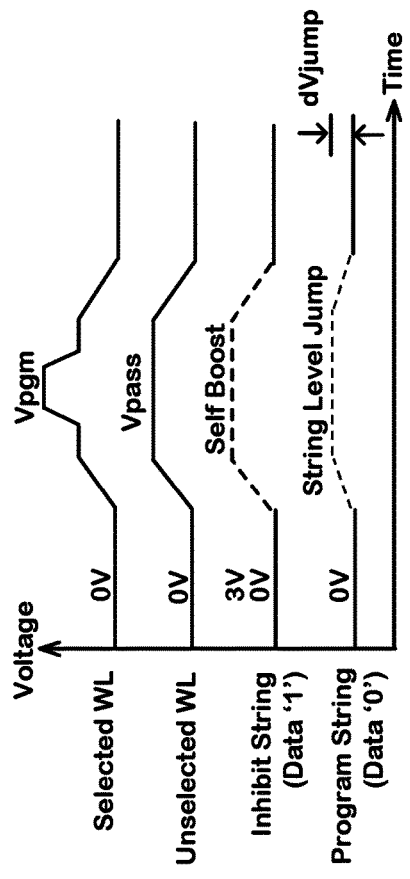
FIG. 3A: Program First Shot
FIG. 3B: Program Nth Shot

FIG. 4A: String Weak Boost

PROGRAM SCHEME IN 3D NAND FLASH MEMORY

BACKGROUND

Field

The present invention relates to high density memory devices, and particularly the program operation of 3D NAND flash memory.

Description of Related Art

As critical dimensions of devices in integrated circuits shrink, designers have been looking to techniques for stacking multiple planes of memory cells to achieve greater storage capacity, and to achieve lower costs per bit. However, in a high density array of vertical channel NAND strings of memory cells, when memory cells in neighboring NAND strings are programmed at the same time, depending on the data pattern for the memory cells, a coupling effect between the NAND strings may cause program disturb to a memory cell in the neighboring NAND strings.

Thus, it is desirable to provide for a technology for programming 3D memories with reduced coupling effect between neighboring vertical channel NAND strings.

SUMMARY

A memory device includes an array of NAND strings of memory cells. The memory device includes a plurality of stacks of word lines separated by insulating material, where the word lines in the stacks have first vertical sides and second vertical sides opposite the first vertical sides. A first plurality of strings in the array is disposed on the first vertical sides of the word lines in a particular stack in the plurality of stacks. A second plurality of strings in the array is disposed on the second vertical sides of the word lines in the particular stack. The strings in the second plurality of strings are offset from the strings in the first plurality of strings in a direction along which the word lines in the particular stack extend. Memory cells arranged along the strings can comprise vertical NAND strings.

The memory device includes a controller configured to execute a first program operation including applying a shielding voltage to a first string in the first plurality of strings, a program voltage to a second string in the second plurality of strings adjacent the first string in the direction along which the word lines in the particular stack extend, the program voltage to a third string in the first plurality of strings, and the shielding voltage to a fourth string in the second plurality of strings adjacent the third string in the direction along which the word lines in the particular stack extend. The second string in the second plurality of strings is adjacent the third string in the first plurality of strings in the direction along which the word lines in the particular stack extend.

The second string in the second plurality of strings is disposed between the first and third strings in the first plurality of strings in the direction along which the word lines in the particular stack extend. The third string in the first plurality of strings is disposed between the second and fourth strings in the second plurality of strings in the direction along which the word lines in the particular stack extend.

The controller is configured to execute a second program operation including applying the program voltage to the first string in the first plurality of strings and the fourth string in the second plurality of strings, and applying the shielding voltage to the second string in the second plurality of strings and the third string in the first plurality of strings.

The memory device includes a first plurality of memory cells disposed at intersections of the first plurality of strings and the word lines in the particular stack, and a second plurality of memory cells disposed at intersections of the second plurality of strings and the word lines in the particular stack. The controller can be configured to, in order to program a set of memory cells including first memory cells in the first plurality of memory cells and second memory cells in the second plurality of memory cells, execute the first program operation on the first memory cells and the second program operation on the second memory cells in sequence.

Word lines in the plurality of stacks of word lines can be implemented using conductive strips in a plurality of stacks of conductive strips. Strings in the first plurality of strings can be implemented using channel lines in a first plurality of channel lines disposed on first vertical sides of the conductive strips in the plurality of stacks of conductive strips. Strings in the second plurality of strings can be implemented using channel lines in a second plurality of channel lines disposed on second vertical sides of the conductive strips in the plurality of stacks of conductive strips.

Methods for operating a memory device including an array of NAND strings of memory cells as described herein are also provided. A first program operation can be executed that includes applying a shielding voltage to a first string in the first plurality of strings, a program voltage to a second string in the second plurality of strings adjacent the first string in the direction along which the word lines in the particular stack extend, the program voltage to a third string in the first plurality of strings, and the shielding voltage to a fourth string in the second plurality of strings adjacent the third string in the direction along which the word lines in the particular stack extend.

A second program operation can be executed that includes applying the program voltage to the first string in the first plurality of strings and the fourth string in the second plurality of strings, and applying the shielding voltage to the second string in the second plurality of strings and the third string in the first plurality of strings.

In order to program a set of memory cells including first memory cells in the first plurality of memory cells and second memory cells in the second plurality of memory cells, the first program operation can be executed on the first memory cells and the second program operation can be executed on the second memory cells, where the first program operation and the second program operation are executed in sequence.

Other aspects and advantages of the present invention can be seen on review of the drawings, the detailed description and the claims, which follow.

BRIEF DESCRIPTION OF THE DRAWINGS

FIG. 3A illustrates example waveforms for a first shot in a typical program operation with program data '0' on a NAND string.

FIG. 3B illustrates example waveforms for an Nth shot in a typical program operation with program data '0' on a NAND string.

FIG. 4A illustrates example waveforms in a typical inhibit operation with program data '1' on a NAND string.

DETAILED DESCRIPTION

Figure 1:
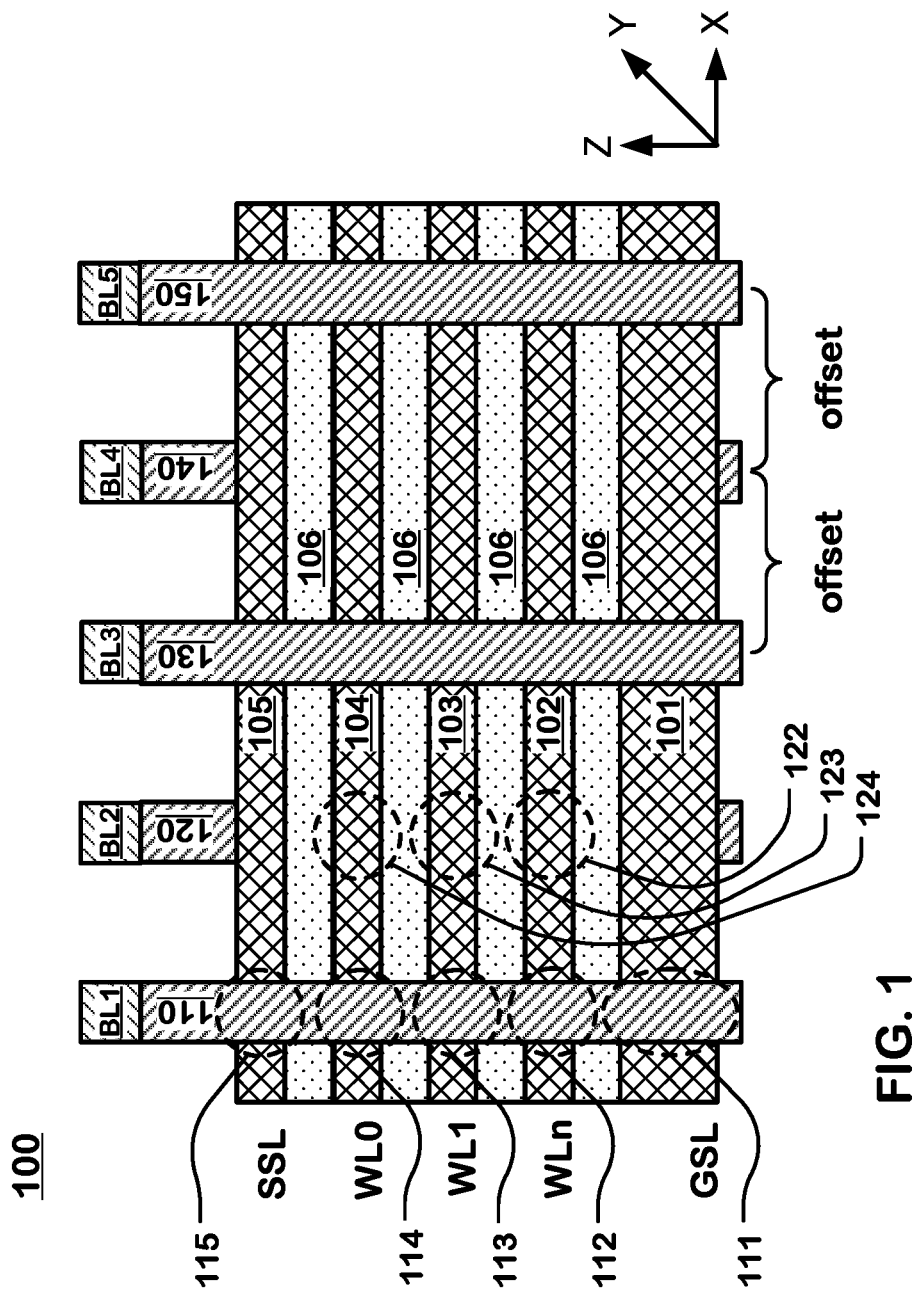
FIG. 1 is an example cross-sectional diagram of an array of NAND strings of memory cells in accordance with the present technology.

A detailed description of embodiments of the present invention is provided with reference to the Figures. The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is an example cross-sectional diagram of a memory device including an array of NAND strings of memory cells in accordance with the present technology, shown in an X-Z plane. As illustrated in the example of FIG. 1, a memory device 100 includes an array of NAND strings of memory cells formed on an integrated circuit substrate. The device includes a plurality of stacks of word lines (e.g. W0, WL1, WLn) separated by insulating material 106. The word lines in the stacks having first vertical sides (e.g. 103a, FIG. 2) and second vertical sides (e.g. 103b, FIG. 2) opposite the first vertical sides.

A first plurality of strings (e.g. 110, 130, 150) in the array of NAND strings is disposed on the first vertical sides of the word lines in a particular stack in the plurality of stacks. A second plurality of strings (e.g. 120, 140) in the array of NAND strings is disposed on the second vertical sides of the word lines in the particular stack. The strings in the second plurality of strings are offset from the string in the first plurality of strings in a direction (e.g. X-direction) along which the word lines in the particular stack extend.

The memory device includes a plurality of stacks of conductive strips, including at least a bottom plane of conductive strips (e.g. 101), a plurality of intermediate planes of conductive strips (e.g. 102-104), and a top plane of conductive strips (e.g. 105). Although three conductive strips are shown in the plurality of intermediate planes, a number of conductive strips in the plurality of intermediate planes can be more than three. For example, a number of conductive strips in the plurality of intermediate planes can be greater than three, e.g. four, eight, sixteen, thirty-two, etc. A plurality of stacks of word lines (e.g. WL0, WL1, WLn) is implemented using the plurality of intermediate planes of conductive strips. A ground select line GSL is implemented using the bottom plane of conductive strips. A string select line SSL is implemented using the top plane of conductive strips. A ground select switch 111 is disposed at intersections of the first plurality of strings and the bottom plane of the conductive strips 101 in the particular stack. A string select switch 115 is disposed at intersections of the first plurality of strings and the top plane of the conductive strips 105 in the particular stack.

A first plurality of memory cells (e.g. 112, 113, 114) is disposed at intersections of the first plurality of strings and the word lines in the particular stack, and a second plurality of memory cells (e.g. 122, 123, 124) is disposed at intersections of the second plurality of strings and the word lines in the particular stack. The memory cells can include data storage structures between the first plurality of strings and the word lines in the particular stack, and between the second plurality of strings and the word lines in the particular stack (e.g. 203a, 203b, FIG. 2).

The conductive strips in the plurality of stacks of conductive strips can be connected to decoding circuitry in the memory device, such as including decoders for word lines WL, string select lines SSL, and ground select lines GSL. A reference conductor (not shown) can be disposed in a level between the bottom plane of conductive strips and the integrated circuit substrate, and connected to the first plurality of strings and the second plurality of strings. The memory device can include an overlying patterned conductive layer connected to the first plurality of strings and the second plurality of strings, including bit lines (e.g. BL1-BL5). For instance, bit lines BL1, BL2, BL3, BL4 and BL5 in the overlying patterned conductive layer can be connected to strings 110, 120, 130, 140 and 150 respectively, and extend in a Y-direction orthogonal to the X-Z plane.

The conductive strips in the plurality of stacks of conductive strips can comprise a variety materials including doped semiconductors, metals, and conductive compounds like Si, Ge, SiGe, SiC, TiN, TaN, W, and Pt. Strings in the first plurality of strings can be implemented using channel lines in a first plurality of channel lines disposed on first vertical sides of the conductive strips in the plurality of stacks of conductive strips. Strings in the second plurality of strings can be implemented using channels in a second plurality of channel lines disposed on second vertical sides of the conductive strips in the plurality of stacks of conductive strips. Channel lines in the first plurality of channel lines and the second plurality of channel lines can comprise semiconductor materials adapted to act as channels for the memory cells, such materials as Si, Ge, SiGE, GaAs, SiC, and Graphene. Charge storage structures in the memory cells in the first plurality of memory cells and the second plurality of memory cells can comprise multilayer dielectric charge trapping structures known from flash memory technologies known in the art as SONOS, BE-SONOS, TANOS, and MA BE-SONOS.

Figure 2:
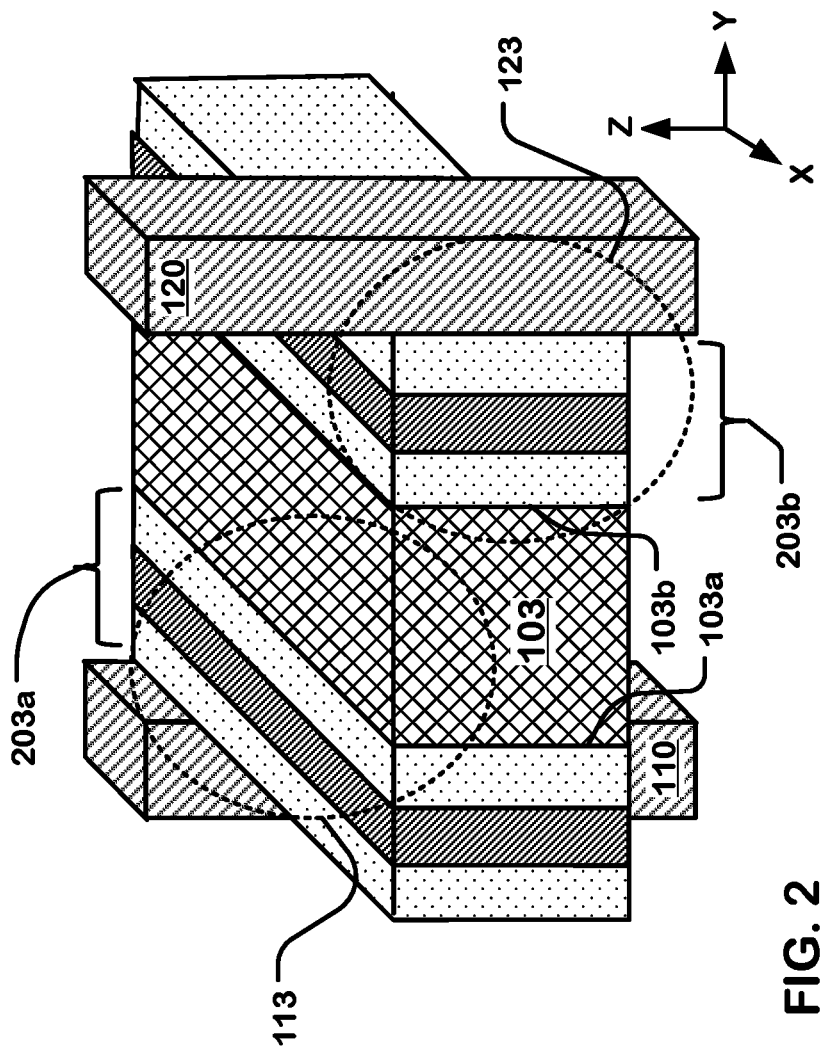
FIG. 2 illustrates a perspective view of first and second vertical channel memory cells disposed at intersections of first and second vertical strings and a word line.

FIG. 2 illustrates a perspective view of a structure including a first vertical channel memory cell disposed at an intersection of a vertical string in the first plurality of strings and a word line, and a second vertical channel memory cell disposed at an intersection of a vertical string in the second plurality of strings and the word line. In FIG. 2, data storage structure 203a is disposed on the first vertical side 103a of the horizontal word line 103. Data storage structure 203b is disposed on the second vertical side 103b of the horizontal word line 103. A thin-film semiconductor strip configured as a vertical string 110 in the first plurality of strings is disposed over the data storage structure 203a on the first vertical side 103a of the word line 103. A thin-film semiconductor strip configured as a vertical string 120 in the second plurality of strings is disposed over the data storage structure 203b on the second vertical side 103b of the word line 103. The string 120 in the second plurality of strings is offset from the string 110 in the first plurality of strings in a direction (e.g. X-direction) along which the word line 103 extends.

As result of the structure, a first memory cell 113 is formed on the first vertical side 103a of the word line 103, and a second memory cell 123 is formed on the second vertical side 103b of the word line 103. The gate of the first memory cell 113 is disposed in the word line 103, and the channel of the first memory cell 113 is disposed in the first vertical string 110. The gate of the second memory cell 123 is disposed in the word line 103, and the channel of the second memory cell 123 is disposed in the second vertical string 120.

Figure 3:
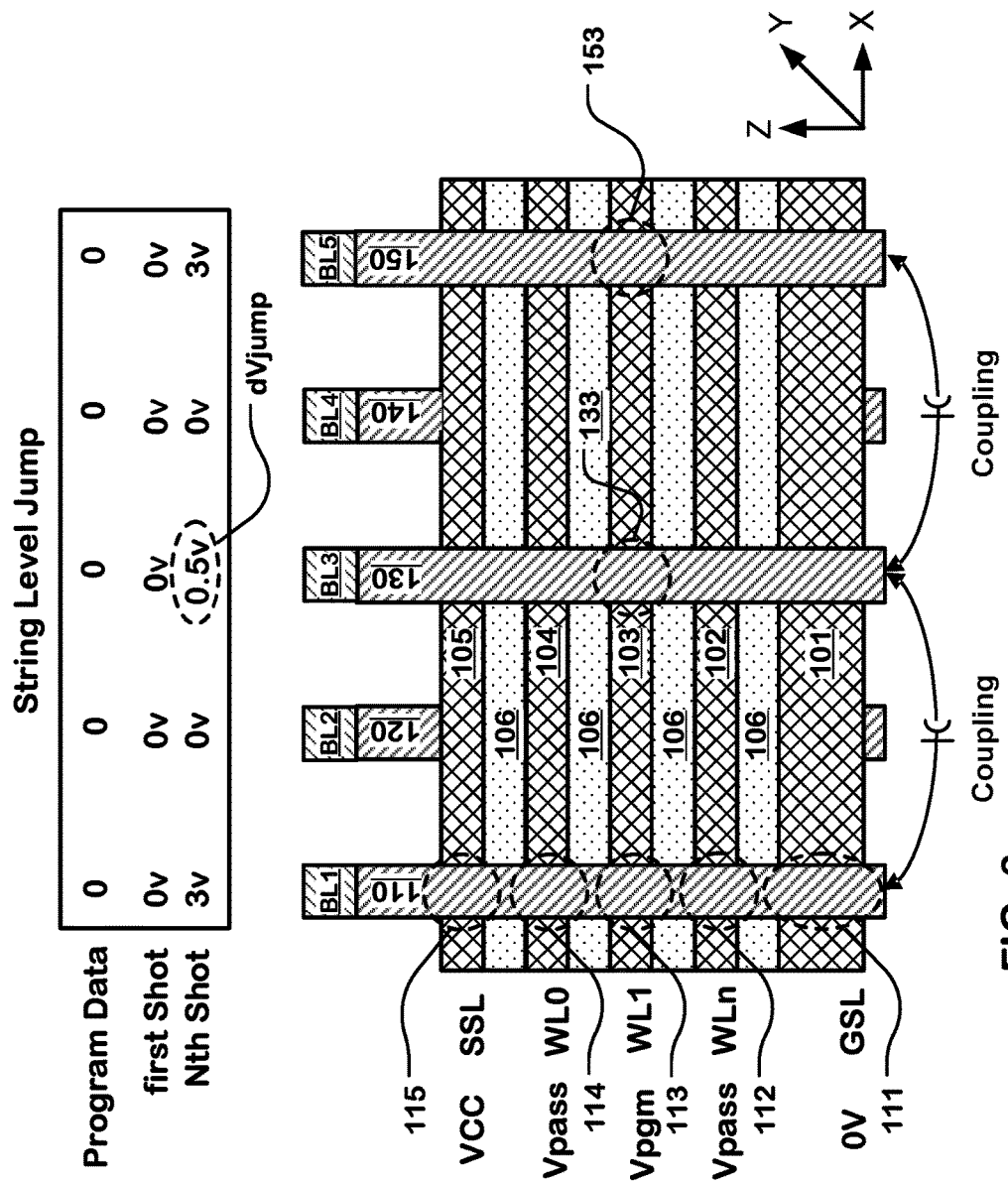
FIG. 3 illustrates string level jump in a program operation for NAND strings in a high density array of NAND strings of memory cells.

FIG. 3 illustrates string level jump in a program operation for NAND strings in a high density array of NAND strings of memory cells. In a typical program operation of a NAND string, the ground select line GSL can be biased at about 0 volt, so that the ground select switch (e.g. 111) corresponding to the GSL is turned off. The string select line SSL can be biased to about $V_{CC}$, so that the string select switch (e.g. 115) corresponding to the SSL is turned on, while a selected bit line (e.g. BL1) connected to a string 110 is biased at about 0 volt. In these conditions, the string (e.g. 110) of the NAND string is pre-charged to about 0 volt. Program voltage can be supplied to selected memory cells (e.g. 113, 133, 153) via the selected word line (e.g. 103). The selected word line (e.g. 103) can receive an incremental step pulse programming (ISPP) operation that includes an iterative sequence of electrical pulses with verify operations, and can reach a magnitude at a high voltage programming level Vpgm. Pass voltage can be supplied to unselected memory cells (e.g. 112, 114) via the unselected word lines (e.g. 102, 104). The unselected word lines (e.g. 102, 104) can receive a pass pulse having a magnitude at a word line pass voltage Vpass, which is less than Vpgm by an amount that boosts up the string and inhibits programming in unselected memory cells in the NAND string. As a result, electrons can tunnel into the charge trapping structure of the selected memory cell (e.g. 113) during the program pulse.

According to ISPP (Incremental Step Pulse Programming), in order to program a selected memory cell to achieve a threshold voltage within a range representing a particular program data value (e.g. '0', '1'), an iterative sequence of program pulses interleaved with verify pulses are executed, in which each succeeding program pulse in the sequence is applied if the verify operation of the preceding iteration fails, has a magnitude stepped up relative to the previous pulse by a constant increment. Between each program pulse, a program verify potential (V-verify) is applied to the word line of the selected memory cell, and the data is sensed, to determine whether the memory cell threshold exceeds the program verify level. The program verify level is set at the low end of the range suitable for the target data value. A program pulse in an ISPP operation can be referred to as a shot, and an ISPP operation can include N shots from the first shot through the Nth shot.

FIG. 3A illustrates example waveforms for a first shot in a typical program operation with program data '0' on a NAND string. As shown in the example of FIG. 3A, the first shot includes a program pulse having a magnitude at a high voltage programming level Vpgm on a selected word line (e.g. WL1, FIG. 3). The unselected word lines (e.g. WL0, WLn, FIG. 3) can receive a pass pulse having a magnitude at a word line pass voltage Vpass, which is less than Vpgm. As used herein, a NAND string under a program operation with program data '0' can be referred to as a program string with data '0', and a NAND string under an inhibit operation with program data '1' can be referred to as an inhibit string with data '1'.

As shown in the example of FIG. 3A, for the first shot, program strings with data '0', such as including a first plurality of strings (e.g. 110, 130, 150, FIG. 3) on the first vertical sides of the word lines in the particular stack (e.g. WL0, WL1, WLn, FIG. 3) and a second plurality of strings (e.g. 120, 140, FIG. 3) on the second vertical sides of the word lines in the particular stack, are biased at a program voltage about 0 volt via the bit lines (e.g. BL1-BL5, FIG. 3).

FIG. 3B illustrates example waveforms for an Nth shot in a typical program operation with program data '0' on a NAND string. For instance, after the Nth shot in an iterative sequence of program pulses that starts with the first shot, the voltage thresholds of selected memory cells (e.g. 113, 153, FIG. 3) on the strings (e.g. 110, 150, FIG. 3) exceed the program verify level, indicating successful programming of the selected memory cells to the program data of "0". At the same time, the voltage threshold of a selected memory cell (e.g. 133, FIG. 3) on the string 130 in-between the strings 110 and 150 has not exceeded the program verify level. Subsequently, bias on the strings 110 and 150 is changed to an inhibit voltage of about 3 volts via self boost, from the program voltage about 0 v applied to the first plurality of strings and the second plurality of strings for the first shot.

However, the coupling effect between two strings (e.g. 110, 150, FIG. 3) biased at an inhibit voltage (e.g. 3 v) on the first vertical sides of the word lines, and a third string (e.g. 130, FIG. 3) not biased at an inhibit voltage but arranged in-between those two strings on the first vertical sides of the word lines, may raise the voltage level in the third string by an amount dVjump (e.g. 0.5V). The amount dVjump may in turn cause a memory cell (e.g. 133, FIG. 3) on the third string (e.g. 130, FIG. 3) to erroneously change an ISPP operation.

Figure 3C:
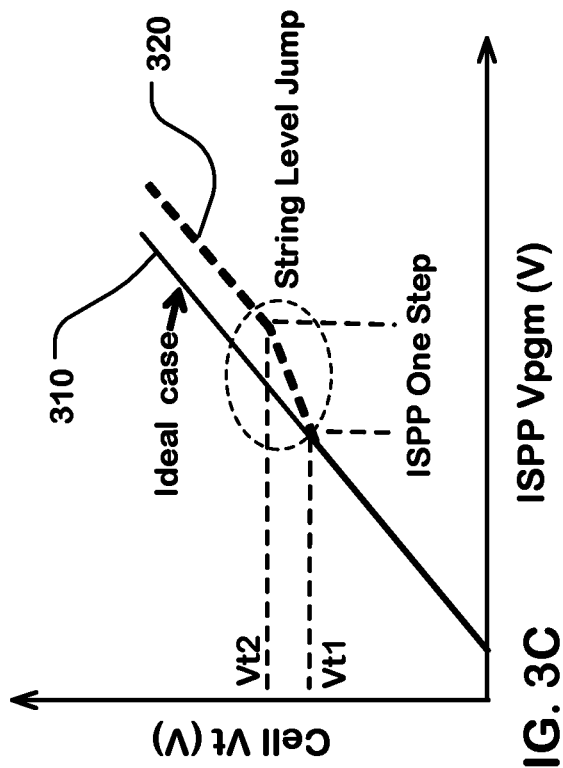
FIG. 3C illustrates example ISPP Vpgm vs memory cell threshold voltage for an Nth shot in a typical program operation with program data '0' on a NAND string.

FIG. 3C illustrates example memory cell threshold voltage Vt vs ISPP program voltage Vpgm for an Nth shot in a typical program operation with program data '0' on a NAND string. A first curve 310 shows an ideal case where a string level jump as described in FIG. 3B does not occur, and an Nth shot results in a threshold voltage Vt1 on the first curve 310. A second curve 320 shows another case where a string level jump (e.g. dVjump, FIGS. 3, 3B) occurs, and consequently an Nth shot erroneously results in a threshold voltage Vt2 on the second curve 320 higher than Vt1.

Figure 4:
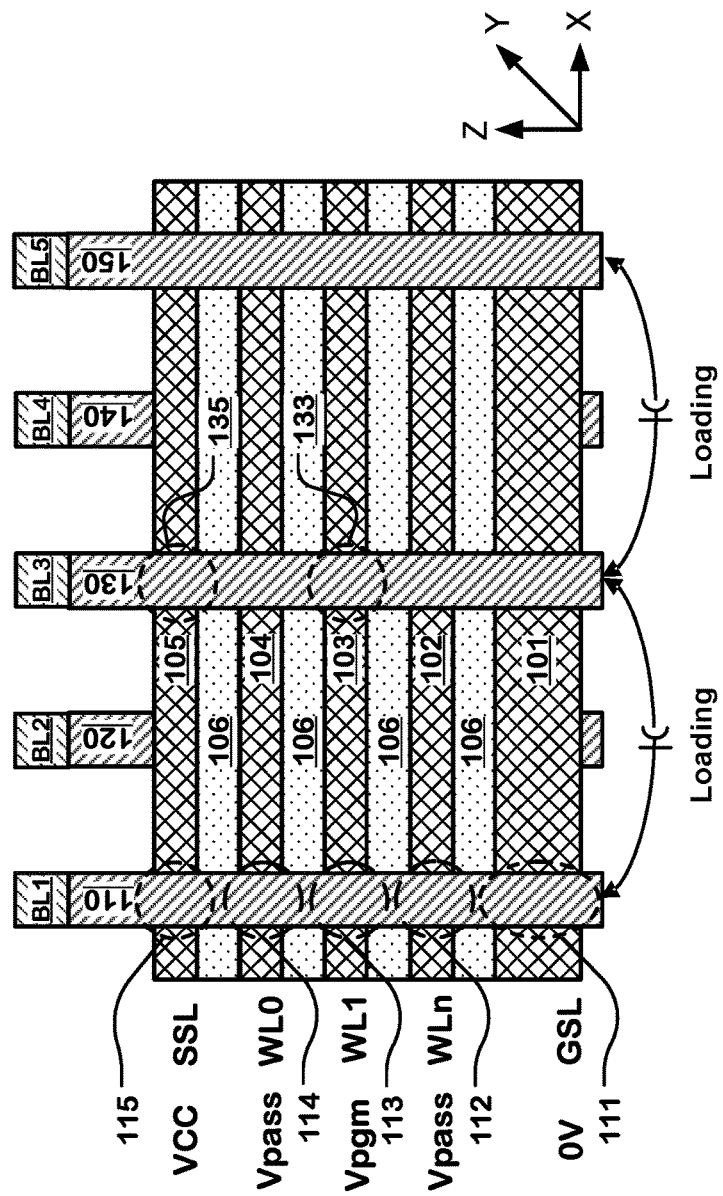
FIG. 4 illustrates weak boost in a program operation for NAND strings in a high density array of NAND strings of memory cells.

FIG. 4 illustrates string weak boost in a program operation for NAND strings in a high density array of NAND strings of memory cells. In this example, a NAND string to be inhibited (e.g. 130) shares the word lines (e.g. 102-104) with the NAND strings to be programmed (e.g. 110, 150). The ground select line GSL, the string select line SSL and the word lines WL0, WL1 and WLn have the same bias voltages as shown in FIG. 3.

FIG. 4A illustrates example waveforms in a typical inhibit operation with program data '1' on a NAND string. As shown in the example of FIG. 4A, a program pulse having a magnitude at a high voltage programming level Vpgm is applied on a selected word line (e.g. WL1, FIG. 4). The unselected word lines (e.g. WL0, WLn, FIG. 4) can receive a pass pulse having a magnitude at a word line pass voltage Vpass, which is less than Vpgm.

As shown in the example of FIG. 4A, program strings with data '0', such as including strings (e.g. 110 and 150, FIG. 4) in the first plurality of strings on the first vertical sides of the word lines (e.g. WL0, WL1, WLn, FIG. 4) and strings (e.g. 120 and 140, FIG. 4) in the second plurality of strings on the second vertical sides of the word lines, are biased at a program voltage about 0 volt via the bit lines (e.g. BL1, BL2, BL4 and BL5, FIG. 4). An inhibit string with data '1', such as including an inhibit bit line (e.g. BL3, FIG. 4) connected to a string (e.g. 130, FIG. 4), is biased at a target inhibit voltage about $V_{CC}$ (e.g. 3 v). This turns off the string select switch (e.g. 135, FIG. 4) coupled to the SSL line, and decouples the string 130 from the inhibit bit line BL3. As a result, the string 130 can be boosted by capacitive coupling from the voltages applied to the word lines (e.g. 102-104), which can prevent formation of electric fields sufficient to disturb the charge trapped or stored in the memory cells in the inhibit NAND string 130.

However, when the selected first and fifth strings (e.g. 110, 150, FIG. 4) adjacent the inhibit third string (e.g. 130, FIG. 4) on the first vertical sides of the word lines are biased at a pre-charge voltage (e.g. 0 volt) lower than the target voltage (e.g. 3 v), capacitive loading between the selected strings and the inhibit string can reduce the boosted voltage in the third string (e.g. 130) from a target voltage (e.g. 3 v) to a real voltage (e.g. 2.5 v). The reduced real voltage can lead to weak boost in the inhibit string, and in turn cause program disturb in the charge trapped or stored in the memory cells on the inhibit string (e.g. 130, FIG. 4) which may erroneously result in a threshold voltage shift of an erased cell (e.g. 133).

Figure 4B:
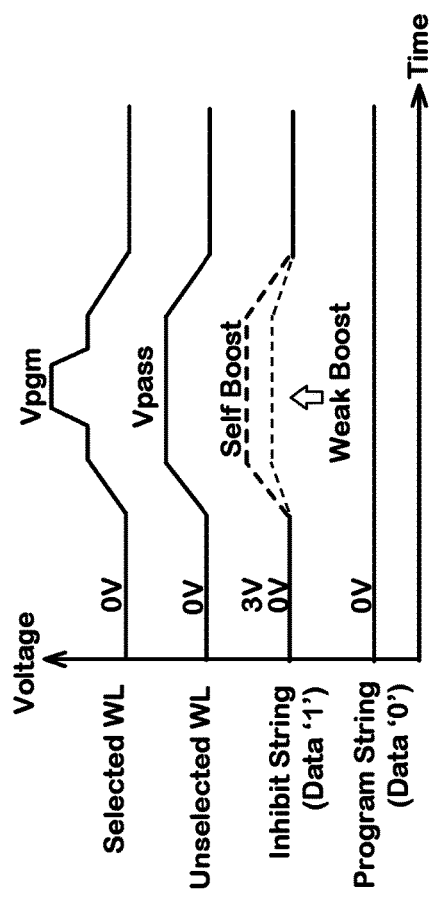
FIG. 4B illustrates example effects of weak boost on distributions of threshold voltages Vt of memory cells.
Figure 4B:
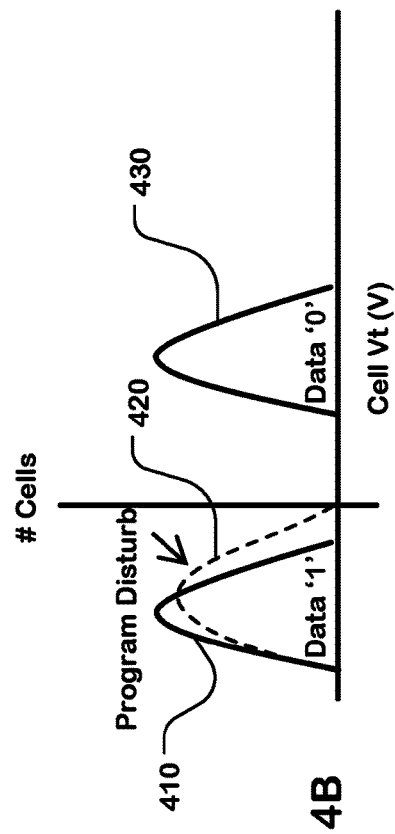

FIG. 4B illustrates example effects of weak boost on distributions of threshold voltages Vt of memory cells. FIG. 4B illustrates a first distribution 410 of threshold voltages Vt of memory cells having data '1', a second distribution 420 of threshold voltages Vt of memory cells having data '1' wider than the first distribution 410, and a third distribution 430 of threshold voltages Vt of memory cells having data '0'. The wider second distribution 420 of threshold voltages Vt of memory cells having data '1' can be caused by the program disturb from the weak boost as described above.

Figure 5:
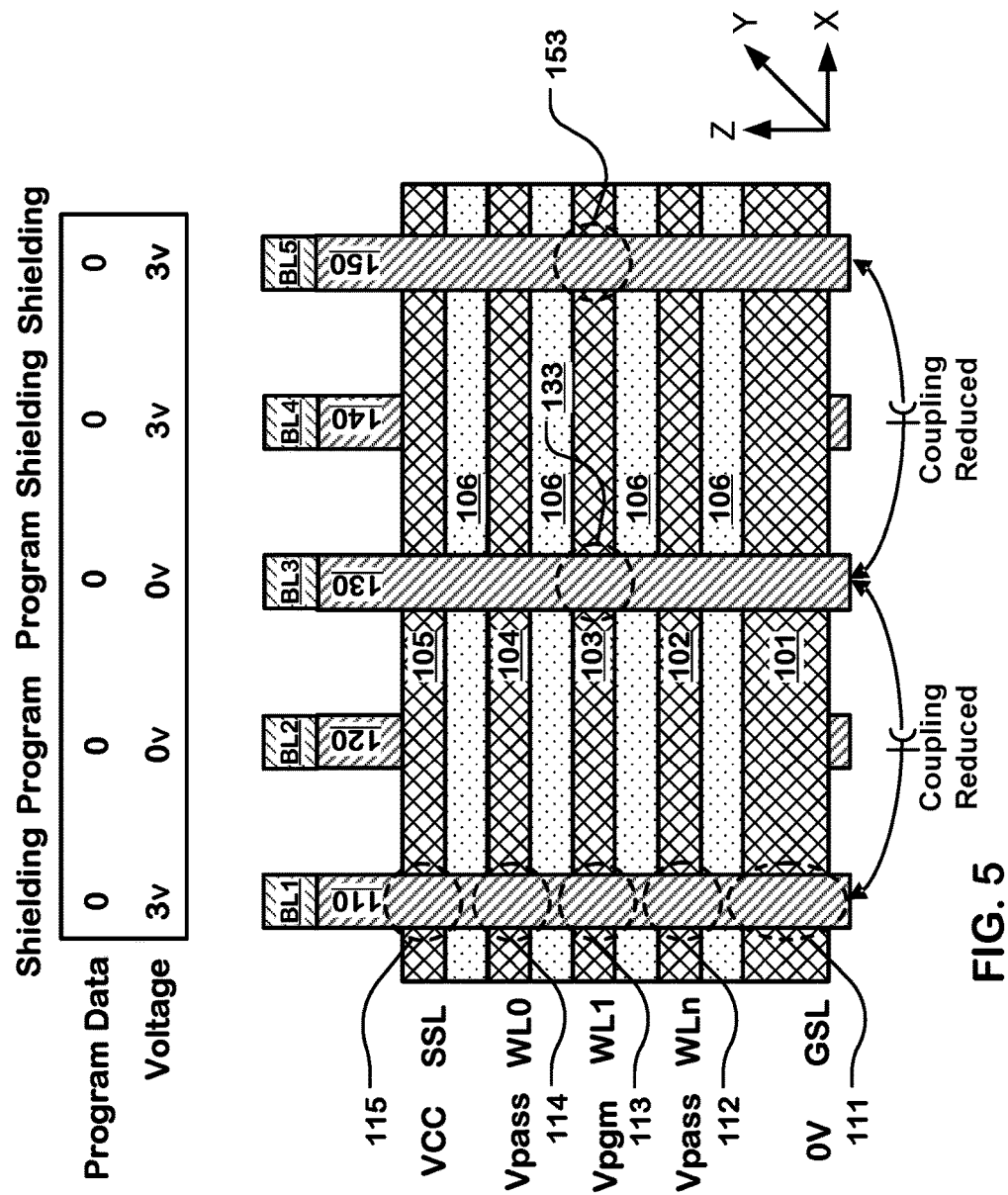
FIG. 5 illustrates a method for operating a memory device including an array of NAND strings of memory cells in accordance with the present technology, including how the string level jump described in reference to FIG. 3 can be reduced.

FIG. 5 illustrates a method for operating a memory device including an array of NAND strings of memory cells in accordance with the present technology, including how the string level jump described in reference to FIG. 3 can be reduced. The memory device is as described in reference to FIGS. 1 and 2. Bias voltages applied to the ground select line GSL, the string select line SSL, the selected word line (e.g. WL1), and the unselected word lines (e.g. WL0, WLn) are as described in reference to FIG. 3.

As shown in the example of FIG. 5, a first program operation can be executed that includes applying a shielding voltage (e.g. 3V) to a first string (e.g. 110) in the first plurality of strings (e.g. 110, 130, 150), a program voltage (e.g. 0V) to a second string (e.g. 120) in the second plurality of strings (e.g. 120, 140) adjacent the first string in the direction along which the word lines (e.g. 102, 103, 104) extend, the program voltage to a third string (e.g. 130) in the first plurality of strings, and the shielding voltage to a fourth string (e.g. 140) in the second plurality of strings adjacent the third string in the direction along which the word lines extend.

A pattern of shielding and program voltages applied to the first, second, third and fourth strings in the first program operation as described herein can be repeated to more bit lines in the first plurality of strings and the second plurality of strings. For instance, the shielding voltage applied to a fifth string 150 can be a voltage applied in a repeated pattern of shielding and program voltages.

In this example of the first program operation, a shielding voltage (e.g. 3 v) is applied to the first and fifth strings (e.g. 110, 150) on the first vertical sides of the word lines, and memory cells on the first and fifth strings are not programmed. The third string (e.g. 130) on the first vertical sides of the word lines is arranged in-between the first and fifth strings. Consequently, the bias on the first and fifth strings does not change from a program voltage (e.g. 0 v) at the first shot to an inhibit voltage (e.g. 3 volts) at the Nth shot as described in reference to FIG. 3. As described in reference to FIG. 3, due to the coupling effect, such change in the bias on the first and fifth strings may raise the voltage level in the third string, and in turn may cause a memory cell (e.g. 133) on the third string (e.g. 130) to erroneously change the ISPP operation. Accordingly, by applying a shielding voltage to the first and fifth strings on the first vertical sides of the word lines, the coupling effect on the third string on the first vertical sides of the word lines arranged in-between the first and fifth strings can be fixed and ISPP steps can be kept constant.

Figure 6:
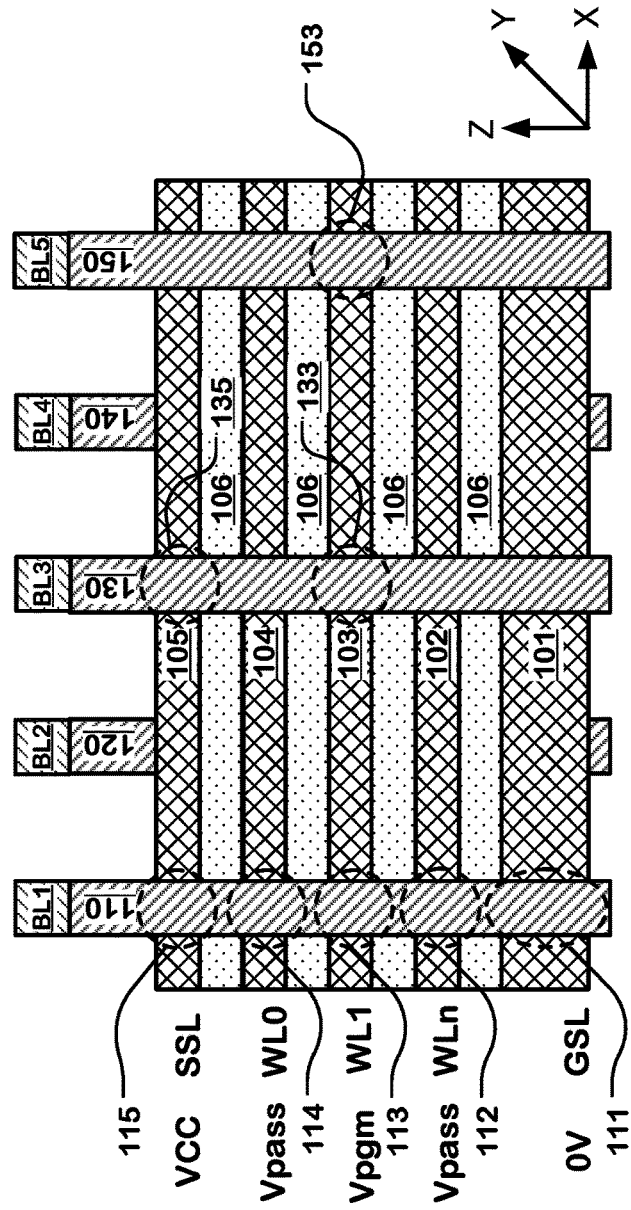
FIG. 6 illustrates a method for operating a memory device including an array of NAND strings of memory cells in accordance with the present technology, including how the weak boost described in reference to FIG. 4 can be prevented.

FIG. 6 illustrates a method for operating a memory device including an array of NAND strings of memory cells in accordance with the present technology, including how the weak boost described in reference to FIG. 4 can be prevented. The memory device is as described in reference to FIGS. 1 and 2. Bias voltages applied to the ground select line GSL, the string select line SSL, the selected word line (e.g. WL1), and the unselected word lines (e.g. WL0, WLn) are as described in reference to FIG. 3.

Bias voltages applied to the first, second, third, fourth and fifth strings are as described in reference to FIG. 5. In particular, as shown in the example of FIG. 6, a first program operation can be executed that includes applying a shielding voltage (e.g. 3V) to the first string (e.g. 110) in the first plurality of strings, the fourth string (e.g. 140) in the second plurality of strings, and the fifth string (e.g. 150) on the first vertical sides of the word lines. A program voltage (e.g. 0V) can be applied to a second string (e.g. 120) in the second plurality of strings adjacent the first string in the direction along which the word lines (e.g. 102, 103, 104) extend.

The inhibit bit line (e.g. BL3) connected to the string 130 is biased at an inhibit voltage about $V_{CC}$ (e.g. 3 v). This turns off the string select switch (e.g. 135) coupled to the SSL line, and decouples the string 130 from the inhibit bit line BL3. As a result, the string 130 can be boosted by capacitive coupling from the voltages applied to the word lines (e.g. 102-104).

As described in reference to FIG. 4, when the first and fifth program strings (e.g. 110, 150) adjacent the third inhibit string (e.g. 130) on the first vertical sides of the word lines are biased at a pre-charge voltage (e.g. 0 volt) lower than the target voltage (e.g. 3 v), capacitive loading between the program strings and the inhibit string can reduce the boosted voltage in the third string (e.g. 130) from a target voltage (e.g. 3 v) to a real voltage (e.g. 2.5 v). The reduced real voltage can lead to weak boost in the inhibit string, and in turn cause program disturb in the charge trapped or stored in the memory cells on the inhibit string (e.g. 130).

In contrast, as shown in the example of FIG. 6, the first and fifth strings (e.g. 110, 150) on the first vertical sides of the word lines are biased at the shielding voltage (e.g. 3 v) that is about the same as the target voltage (e.g. 3 v) for boosting the inhibit string. Consequently the capacitive loading between the program strings biased at the inhibit voltage and the inhibit string is reduced. In turn the third program string (e.g. 130) can be boosted to a voltage higher than the reduced real voltage as described in reference to FIG. 4, and closer to the target voltage than the reduced real voltage.

Figure 7:
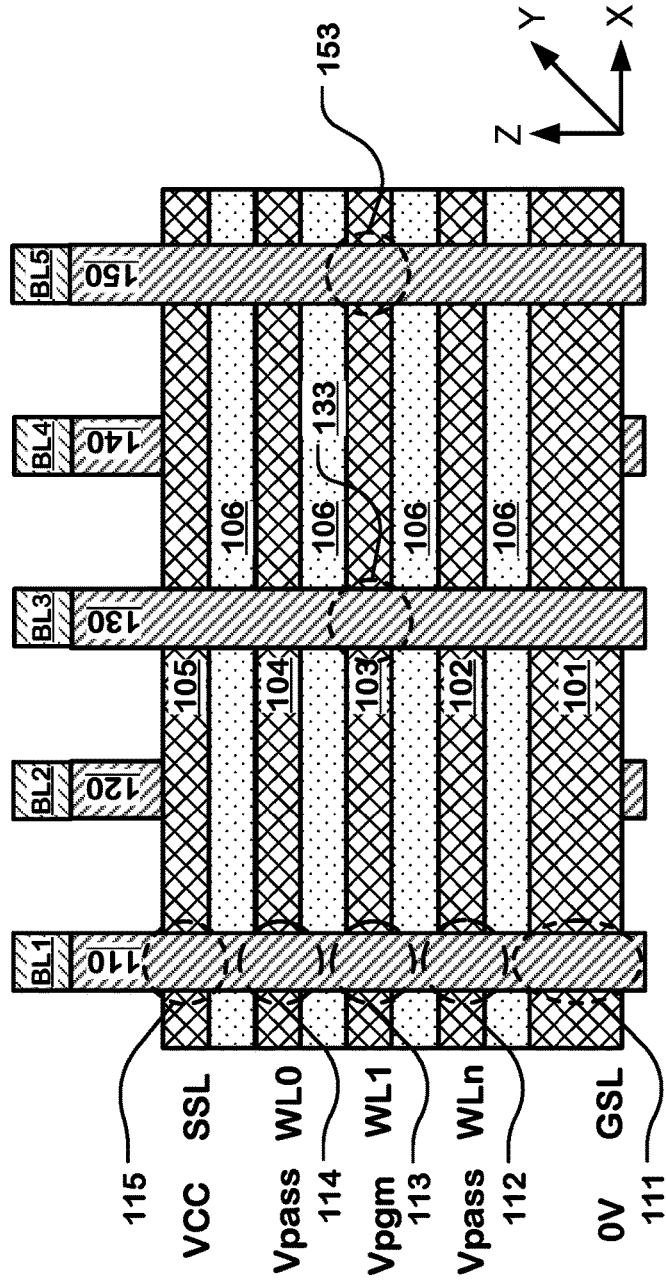
FIG. 7 illustrates a second program operation in a method for operating a memory device including an array of NAND strings of memory cells in accordance with the present technology.

FIG. 7 illustrates a second program operation in a method for operating a memory device including an array of NAND strings of memory cells in accordance with the present technology. The memory device is as described in reference to FIGS. 1 and 2. Bias voltages applied to the ground select line GSL, the string select line SSL, the selected word line (e.g. WL1), and the unselected word lines (e.g. WL0, WLn) are as described in reference to FIG. 3.

As shown in the example of FIG. 7, a second program operation can be executed that includes applying a program voltage (e.g. 0V) to the first string (e.g. 110) in the first plurality of strings (e.g. 110, 130, 150) and the fourth string (e.g. 140) in the second plurality of strings (e.g. 120, 140), and applying the shielding voltage (e.g. 3V) to the second string (e.g. 120) in the second plurality of strings and the third string (e.g. 130) in the first plurality of strings.

A pattern of shielding and program voltages in the second program operation applied to the first, second, third and fourth strings as described herein can be repeated to more bit lines in the first plurality of strings and the second plurality of strings. For instance, the program voltage applied to a fifth string 150 in the first plurality of strings can be a voltage applied in a repeated pattern of shielding and program voltages in the second program operation.

In order to program a set of memory cells including first memory cells in the first plurality of memory cells and second memory cells in the second plurality of memory cells, the first program operation can be executed on the first memory cells and the second program operation can be executed on the second memory cells, where the first program operation and the second program operation are executed in sequence. In one embodiment, the second program operation can be executed subsequent to the first program operation. In an alternative embodiment, the first program operation can be executed subsequent to the second program operation.

Figure 8:
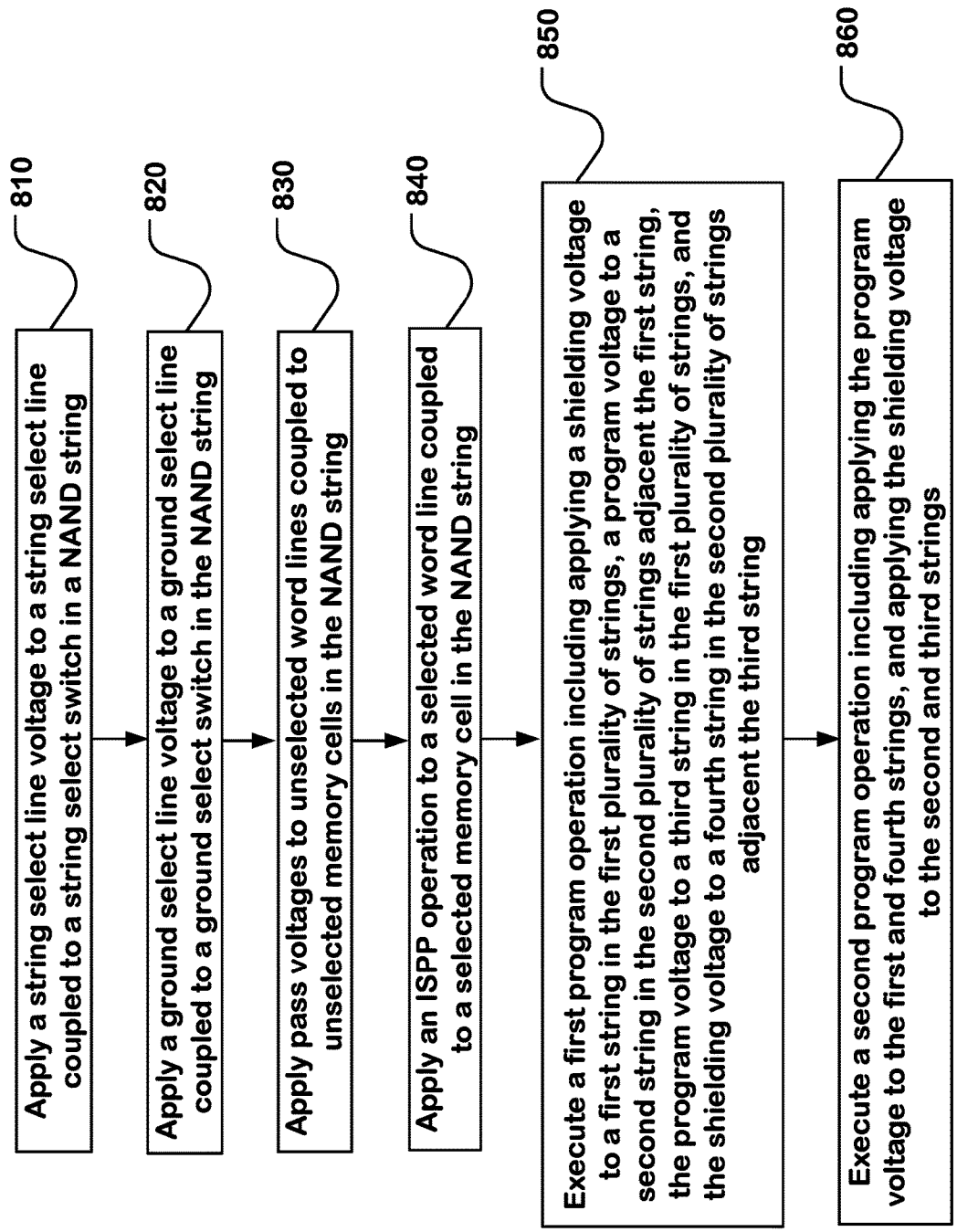
FIG. 8 is a simplified flowchart for a method of operating a memory device including an array of NAND strings of memory cells as described herein.

FIG. 8 is a simplified flowchart for a method of operating a memory device including an array of NAND strings of memory cells as described herein. The memory device comprises a plurality of stacks of word lines separated by insulating material, the word lines in the particular stack having first vertical sides and second vertical sides opposite the first vertical sides. A first plurality of strings is disposed on the first vertical sides of the word lines in the particular stack, and a second plurality of strings is disposed on the second vertical sides of the word lines in the particular stack. The strings in the second plurality of strings are offset from the strings in the first plurality of strings in a direction along which the word lines in the particular stack extend. The second string in the second plurality of strings is adjacent the third string in the first plurality of strings in the direction along which the word lines in the particular stack extend.

At Step 810, a string select line voltage (e.g. $V_{CC}$ can be applied to a string select line coupled to a string select switch in a NAND string, so that the string select switch coupled to the string select line is turned on.

At Step 820, a ground select line voltage (e.g. 0V) can be applied to a ground select line coupled to a ground select switch in the NAND string, so that the ground select switch coupled to the GSL is turned off.

At Step 830, pass voltages can be applied to unselected word lines coupled to unselected memory cells in the NAND string. The pass voltages can inhibit programming in the unselected memory cells.

At Step 840, an incremental step pulse programming (ISPP) operation that includes an iterative sequence of electrical pulses with verify operations can be applied to a selected word line coupled to a selected memory cell in the NAND string.

At Step 850, a first program operation can be executed that includes applying a shielding voltage to a first string in the first plurality of strings, a program voltage to a second string in the second plurality of strings adjacent the first string in the direction along which the word lines in the particular stack extend, the program voltage to a third string in the first plurality of strings, and the shielding voltage to a fourth string in the second plurality of strings adjacent the third string in the direction along which the word lines in the particular stack extend.

At Step 860, a second program operation can be executed that includes applying the program voltage to the first string in the first plurality of strings and the fourth string in the second plurality of strings, and applying the shielding voltage to the second string in the second plurality of strings and the third string in the first plurality of strings.

The memory device can comprise a first plurality of memory cells disposed at intersections of the first plurality of strings and the word lines in a particular stack in the plurality of stacks, and a second plurality of memory cells disposed at intersections of the second plurality of strings and the word lines in the particular stack.

Order of steps shown in the flowchart does not indicate order of executions of the steps. For instance, in order to program a set of memory cells including first memory cells in the first plurality of memory cells and second memory cells in the second plurality of memory cells, the first program operation can be executed on the first memory cells and the second program operation can be executed on the second memory cells in sequence. In one embodiment, Step 860 can be executed subsequent to step 850. In an alternative embodiment, Step 850 can be executed subsequent to step 860.

Table below illustrates a shielding voltage that can be applied to bit lines in an array of NAND strings of memory cells to shield NAND strings of memory cells coupled to the bit lines from a program operation, in accordance with the present technology. In contrast, a conventional program scheme does not include applying a shielding voltage to shield NAND strings of memory cells from a program operation.

| Program Data | Voltage Level | Example Voltage Value |
|---|---|---|
| Conventional Program Scheme | | |
| Select BL      0 | Program Voltage | 0V |
| Select BL      1 | Inhibit Voltage | 3V |
| Present Technology | | |
| Select BL      0 | Program Voltage | 0V |
| Select BL      1 | Inhibit Voltage | 3V |
| Unselect BL   Don't Care | Shielding Voltage | 3V |

In one embodiment, a first program operation includes applying a shielding voltage to a first string in a first plurality of strings and a fourth string in a second plurality of strings, and applying a program voltage to a second string in the second plurality of strings and a third string in the first plurality of strings. A second program operation includes applying the program voltage to the first string in the first plurality of strings and the fourth string in the second plurality of strings, and applying the shielding voltage to the second string in the second plurality of strings and the third string in the first plurality of strings.

Figure 9:
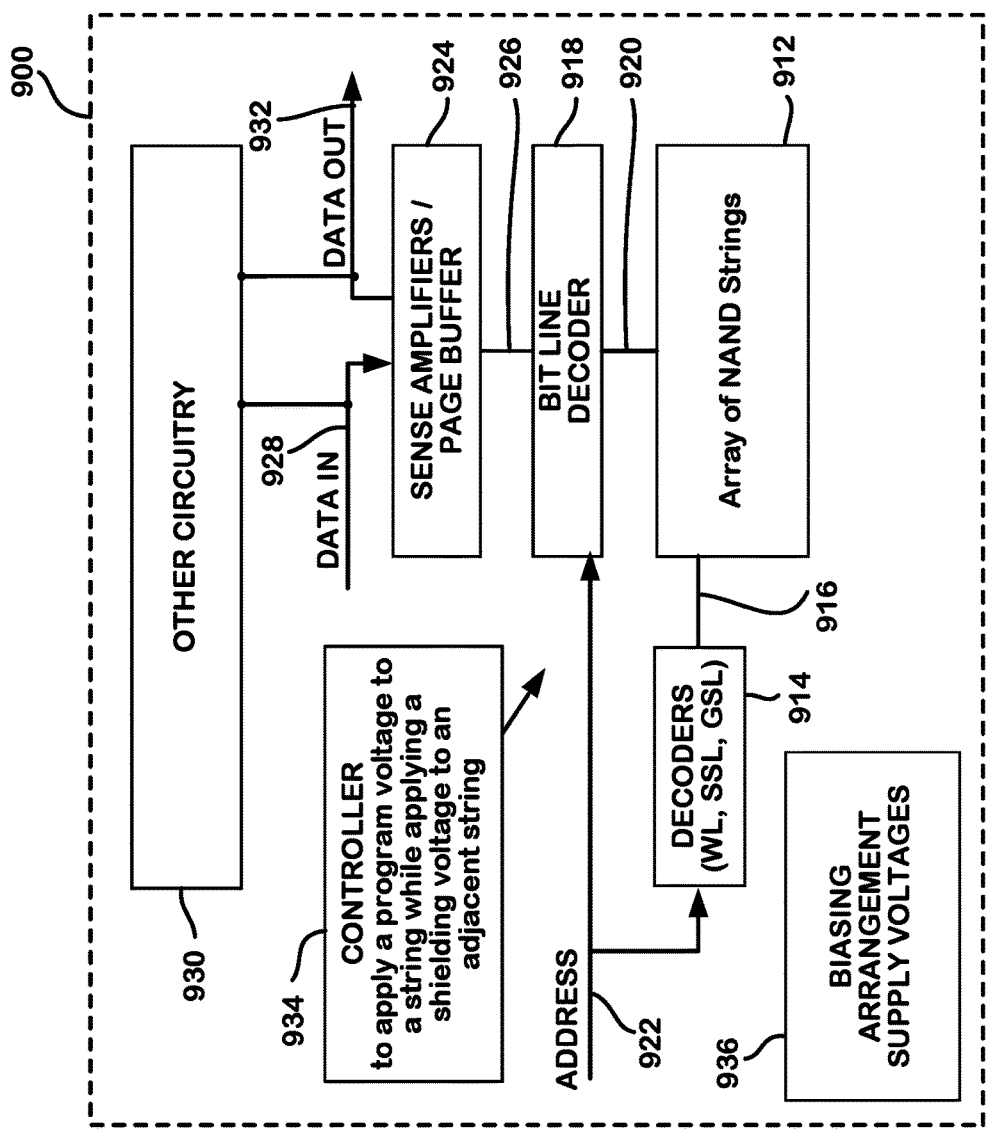
FIG. 9 is a block diagram of an integrated circuit memory device including an array of NAND strings of memory cells memory cells in accordance with the present technology.

FIG. 9 is a block diagram of an integrated circuit memory device including an array of NAND strings of memory cells in accordance with the present technology. The integrated circuit 900 includes an array of NAND strings 912 implemented using charge trapping memory cells or floating gate memory cells, for example, on a semiconductor substrate. The array 912 can include a NAND string that includes a plurality of memory cells arranged in series. A word line (or row), ground select and string select decoder 914 are coupled to, and in electrical communication with, a plurality 916 of word lines, string select lines and ground select lines, arranged along rows in the memory array 912.

A bit line (column) decoder are coupled to and in electrical communication with a plurality of bit lines 920 arranged along columns in the memory array 912 for reading data from, and writing data to, the memory cells in the memory array 912. Addresses are supplied on bus 922 to the word line decoder and string select decoder 914 and to the bit line decoder 918. Sense amplifiers and a page buffer in block 924, including current sources for the read, program and erase modes, are coupled to the bit line decoder 918 via data bus 926. Data is supplied via the data-in line 928 from input/output ports on the integrated circuit 900 or from other data sources internal or external to the integrated circuit 900, to the data-in structures in block 924. In the illustrated embodiment, other circuitry 930 is included on the integrated circuit 900, such as a general purpose processor or special purpose application circuitry, or a combination of modules providing system-on-a-chip functionality supported by the memory cell array. Data is supplied via the data-out line 932 from the sense amplifiers in block 924 to input/output ports on the integrated circuit 900, or to other data destinations internal or external to the integrated circuit 900.

A controller 934 implemented in this example, using a bias arrangement state machine, controls the application of bias arrangement supply voltages and current sources 936, such as read, program, erase, erase verify, program verify voltages or currents for the word lines and bit lines, and controls the word line/source line operation using an access control process.

The controller 934 can be configured to execute a first program operation including applying a shielding voltage to a first string in the first plurality of strings, a program voltage to a second string in the second plurality of strings adjacent the first string in the direction along which the word lines in the particular stack extend, the program voltage to a third string in the first plurality of strings, and the shielding voltage to a fourth string in the second plurality of strings adjacent the third string in the direction along which the word lines in the particular stack extend.

The controller 934 can be configured to execute a second program operation including applying the program voltage to the first string in the first plurality of strings and the fourth string in the second plurality of strings, and applying the shielding voltage to the second string in the second plurality of strings and the third string in the first plurality of strings.

In order to program a set of memory cells including first memory cells in the first plurality of memory cells and second memory cells in the second plurality of memory cells, the controller 934 can be configured to execute the first program operation on the first memory cells and the second program operation on the second memory cells in sequence.

The controller 934 can be implemented using special purpose logic circuitry as known in the art. In alternative embodiments, the controller 934 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 934.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

The invention claimed is:

1. A memory device including an array of NAND strings of memory cells, comprising:
   a plurality of stacks of word lines separated by insulating material, the word lines in the stacks having first vertical sides and second vertical sides opposite the first vertical sides;
   a first plurality of strings in the array disposed on the first vertical sides of the word lines in a particular stack in the plurality of stacks;
   a second plurality of strings in the array disposed on the second vertical sides of the word lines in the particular stack, the strings in the second plurality of strings being offset from the strings in the first plurality of strings in a direction along which the word lines in the particular stack extend; and
   a controller configured to execute a first program operation including applying a shielding voltage to a first string in the first plurality of strings, a program voltage to a second string in the second plurality of strings adjacent the first string in the direction along which the word lines in the particular stack extend, the program voltage to a third string in the first plurality of strings, and the shielding voltage to a fourth string in the second plurality of strings adjacent the third string in the direction along which the word lines in the particular stack extend.

2. The memory device of claim 1, wherein the second string in the second plurality of strings is adjacent the third string in the first plurality of strings in the direction along which the word lines in the particular stack extend.

3. The memory device of claim 1, wherein the second string in the second plurality of strings is disposed between the first and third strings in the first plurality of strings in the direction along which the word lines in the particular stack extend, and the third string in the first plurality of strings is disposed between the second and fourth strings in the second plurality of strings in the direction along which the word lines in the particular stack extend.

4. The memory device of claim 1, the controller configured to execute a second program operation including applying the program voltage to the first string in the first plurality of strings and the fourth string in the second plurality of strings, and applying the shielding voltage to the second string in the second plurality of strings and the third string in the first plurality of strings.

5. The memory device of claim 4, comprising:
a first plurality of memory cells disposed at intersections of the first plurality of strings and the word lines in the particular stack, and a second plurality of memory cells disposed at intersections of the second plurality of strings and the word lines in the particular stack; and
the controller configured to, in order to program a set of memory cells including first memory cells in the first plurality of memory cells and second memory cells in the second plurality of memory cells, execute the first program operation on the first memory cells and the second program operation on the second memory cells in sequence.

6. The memory device of claim 1, wherein word lines in the plurality of stacks of word lines are implemented using conductive strips in a plurality of stacks of conductive strips.

7. The memory device of claim 6, wherein strings in the first plurality of strings are implemented using channel lines in a first plurality of channel lines disposed on first vertical sides of the conductive strips in the plurality of stacks of conductive strips.

8. The memory device of claim 6, wherein strings in the second plurality of strings are implemented using channel lines in a second plurality of channel lines disposed on second vertical sides of the conductive strips in the plurality of stacks of conductive strips.

9. A method for operating a memory device including an array of NAND strings of memory cells, the memory device comprising a plurality of stacks of word lines separated by insulating material, the word lines in the stacks having first vertical sides and second vertical sides opposite the first vertical sides; a first plurality of strings disposed on the first vertical sides of the word lines in a particular stack in the plurality of stacks; and a second plurality of strings disposed on the second vertical sides of the word lines in the particular stack, the strings in the second plurality of strings being offset from the strings in the first plurality of strings in a direction along which the word lines in the particular stack extend; the method comprising:
executing a first program operation including applying a shielding voltage to a first string in the first plurality of strings, a program voltage to a second string in the second plurality of strings adjacent the first string in the direction along which the word lines in the particular stack extend, the program voltage to a third string in the first plurality of strings, and the shielding voltage to a fourth string in the second plurality of strings adjacent the third string in the direction along which the word lines in the particular stack extend.

10. The method of claim 9, wherein the second string in the second plurality of strings is adjacent the third string in the first plurality of strings in the direction along which the word lines in the particular stack extend.

11. The method of claim 9, wherein the second string in the second plurality of strings is disposed between the first and third strings in the first plurality of strings in the direction along which the word lines in the particular stack extend, and the third string in the first plurality of strings is disposed between the second and fourth strings in the second plurality of strings in the direction along which the word lines in the particular stack extend.

12. The method of claim 9, comprising:
executing a second program operation including applying the program voltage to the first string in the first plurality of strings and the fourth string in the second plurality of strings and applying the shielding voltage to the second string in the second plurality of strings and the third string in the first plurality of strings.

13. The method of claim 12, the memory device comprising a first plurality of memory cells disposed at intersections of the first plurality of strings and the word lines in the particular stack, and a second plurality of memory cells disposed at intersections of the second plurality of strings and the word lines in the particular stack, the method comprising:
in order to program a set of memory cells including first memory cells in the first plurality of memory cells and second memory cells in the second plurality of memory cells, executing the first program operation on the first memory cells and the second program operation on the second memory cells in sequence.

14. The method of claim 9, wherein word lines in the plurality of stacks of word lines are implemented using conductive strips in a plurality of stacks of conductive strips.

15. The method of claim 14, wherein strings in the first plurality of strings are implemented using channel lines in a first plurality of channel lines disposed on first vertical sides of the conductive strips in the plurality of stacks of conductive strips.

16. The method of claim 14, wherein strings in the second plurality of strings are implemented using channel lines in a second plurality of channel lines disposed on second vertical sides of the conductive strips in the plurality of stacks of conductive strips.

17. A memory device including an array of NAND strings of memory cells, comprising:
a plurality of stacks of word lines separated by insulating material, the word lines in the stacks having first vertical sides and second vertical sides opposite the first vertical sides;
a first plurality of strings in the array disposed on the first vertical sides of the word lines in a particular stack in the plurality of stacks;
a second plurality of strings in the array disposed on the second vertical sides of the word lines in the particular stack, the strings in the second plurality of strings being offset from the strings in the first plurality of strings in a direction along which the word lines in the particular stack extend; and
a controller configured to execute:
a first program operation including applying a shielding voltage to a first string in the first plurality of strings and a fourth string in the second plurality of strings, applying a program voltage to a second string in the second plurality of strings and a third string in the first plurality of strings; and a second program operation including applying the program voltage to the first string in the first plurality of strings and the fourth string in the second plurality of strings, and applying the shielding voltage to the second string in the second plurality of strings and the third string in the first plurality of strings, wherein in a direction along which the word lines in the particular stack extend, the second string is adjacent the first string, the third string is adjacent the second string, and the fourth string is adjacent the third string.

18. The memory device of claim 17, wherein word lines in the plurality of stacks of word lines are implemented using conductive strips in a plurality of stacks of conductive strips.

19. The memory device of claim 18, wherein strings in the first plurality of strings are implemented using channel lines in a first plurality of channel lines disposed on first vertical sides of the conductive strips in the plurality of stacks of conductive strips.

20. The memory device of claim 19, wherein strings in the second plurality of strings are implemented using channel lines in a second plurality of channel lines disposed on second vertical sides of the conductive strips in the plurality of stacks of conductive strips.

* * * * *